(12) United States Patent
Jurczak et al.

(10) Patent No.: US 7,494,902 B2
(45) Date of Patent: Feb. 24, 2009

(54) METHOD OF FABRICATING A STRAINED MULTI-GATE TRANSISTOR

(75) Inventors: Malgorzata Jurczak, Leuven (BE); Rita Rooyackers, Kessel-lo (BE); Nadine Collaert, Blanden (BE)

(73) Assignee: Interuniversitair Microelektronica Centrum vzw (IMEC), Leuven (BE)

( * ) Notice: Subject to any disclaimer, the term of this patent is extended or adjusted under 35 U.S.C. 154(b) by 0 days.

(21) Appl. No.: 11/767,440

(22) Filed: Jun. 22, 2007

(65) Prior Publication Data

US 2007/0298549 A1 Dec. 27, 2007

Related U.S. Application Data

(60) Provisional application No. 60/816,137, filed on Jun. 23, 2006.

(30) Foreign Application Priority Data

Dec. 8, 2006 (JP) ............................. 2006-331353

(51) Int. Cl.
*H01L 21/20* (2006.01)

(52) U.S. Cl. .................... 438/479; 438/464; 438/407; 438/E21.129; 438/E21.133

(58) Field of Classification Search ................ 438/373, 438/479, 407, 464, 795
See application file for complete search history.

(56) References Cited

U.S. PATENT DOCUMENTS 6,562,703 B1*  5/2003  Maa et al. .................... 438/518
2006/0019464 A1*  1/2006  Maa et al. .................... 438/458

* cited by examiner

*Primary Examiner*—Dung A. Le
(74) *Attorney, Agent, or Firm*—Knobbe, Martens, Olson & Bear, LLP

(57) ABSTRACT

A method is disclosed for relaxing strain in a multi-gate device, the method comprising providing a substrate with a strained material, patterning a plurality of fins in the strained material, defining a first region comprising at least one fin, defining a second region comprising at least one fin, providing a diffusion barrier layer on the first region, performing a hydrogen anneal such that the strain in the second region is relaxed.

19 Claims, 4 Drawing Sheets

METHOD OF FABRICATING A STRAINED MULTI-GATE TRANSISTOR

CROSS-REFERENCE TO RELATED APPLICATIONS

This application claims the benefit of U.S. Provisional Application No. 60/816,137, filed on Jun. 23, 2006, which is hereby incorporated by reference in its entirety.

BACKGROUND OF THE INVENTION

1. Field of the Invention

The present invention generally relates to the improvement of the performance of semiconductor devices, such as multi-gate devices. More specifically, this invention relates to a method for mobility enhancement in these multi-gate devices.

2. Description of the Related Technology

The scaling down of silicon metal-oxide-semiconductor (MOS) devices has become a major challenge in the semiconductor industry. While previously, the shrinking of device features has already given many improvements in integrated circuit (IC) performance, nowadays new techniques, methods and materials are desirable beyond the 90 nm technology node.

One major problem in the scaling of conventional planar devices is the short channel effect, which starts to dominate over the device performance. A solution for this problem has been provided with the introduction of multi-gate field effect transistors (MUGFET). Due to their three dimensional architecture, with the gate wrapped around a thin silicon fin, an improved gate control (and thus less short channel effects) over the channel could be achieved by using multiple gates.

However, the introduction of this new device architecture has caused new problems. One of them is the mobility of the carriers in the device. Due to the different crystallographic orientations of the top surface and the sidewall surfaces of the fin, a difference in mobility is observed for electrons and holes. When using a standard (100) wafer surface with a <110> notch, the electron mobility in an nMOS MUGFET is compromised significantly due to the less favorable crystal orientation of the sidewall surfaces. The largest contribution to the overall drain current comes from these sidewall surfaces with (110)/<110> orientation/direction, which is the worst case for electron mobility. The (100)/<110> orientation/direction at the top surface of the nMOS MUGFET however is very beneficial for electron mobility, but this part only has a smaller contribution to the overall drain current. For a pMOS MUGFET however the opposite occurs. While the (110)/<110> orientation/direction at the sidewall surfaces is very beneficial for the hole mobility, the (100)/<110> orientation/direction at the top surface is less favorable.

Different possibilities have been suggested to enhance the mobility for both nMOS and pMOS MUGFET, all depending on the same principle, namely the introduction of strain in order to boost both electron and hole mobility. For these solutions, one should keep in mind that the semiconductor material of the fin/channel has its crystal orientation dependent sensitivity for charge mobility towards stress. For nMOS devices, on a standard (100)/<110> substrate, tensile stress in the parallel direction along the channel and compressive stress in the vertical direction perpendicular to the wafer surface is beneficial. For pMOS devices, the opposite occurs; compressive stress in the parallel direction along the channel and tensile stress in the vertical direction perpendicular to the wafer surface is beneficial.

Strain can be introduced in the fin/channel in two ways: a biaxial global strain or a uniaxial local strain.

The first is also referred to as substrate-induced strain. Biaxial global strain known in the prior-art, as explained in a paper by J. Wesler et al. "NMOS and PMOS Transistors Fabricated in Strained Silicon/Relaxed Silicon-Germanium Structures," *Electron Devices Meeting,* 1992 *Technical Digest* (Dec. 13, 1992) pp. 31.7.1-31.7.3., is the introduction of a graded silicon germanium (SiGe) substrate with strained silicon (Si) surface layer. Due to the higher lattice constant of the relaxed SiGe compared to relaxed Si, the Si lattice is forced to align with the SiGe lattice and as a consequence, the Si surface layer will be under biaxial tensile strain and thus also the channel region formed in this strained Si layer. Due to the biaxial strain, this technique is advantageous for both pMOS and nMOS devices. One disadvantage, however, is the decrease in performance for shorter gate lengths.

Another possibility for introducing biaxial global strain is the use of a strained silicon on insulator (SSOI) substrate, as presented in a paper by E. Augendre et al. "On the scalability of source/drain current enhancement in thin film sSOI", *Proceedings of the 35th European Solid-State Device Research Conference* 2005 (ESSDERC 2005, 12-16 Sep. 2005), pp. 301-304. By using a strained silicon-on-insulator (SSOI) substrate, the benefits of using a SOI substrate (improved isolation, reduction of parasitic capacitance) and the benefits of using strained silicon (mobility enhancement) can be combined. However, in this case only nMOS devices show better performance.

Another possibility is the use of silicon germanium on insulator (SGOI) substrate, as presented in a paper by T. Irisawa et al. "High current drive uniaxially-strained SGOI for pMOSFETs fabricated by lateral strain relaxation technique", *Symposium of VLSI Technology Digest of Technical Papers* 2005 (14-16 Jun. 2006), pp. 178-179. A SGOI substrate combines the benefits of using an SOI substrate (improved isolation, reduction of parasitic capacitance) and using SiGe technology (mobility enhancement). However, in this case only pMOS devices show better performance.

For the introduction of uniaxial local strain, different approaches have been explored. One approach is the introduction of stress liners on top of the MUGFET device, as explained in a paper of Collaert et al., "Performance improvement of tall triple gate devices with strained SiN layers", *Electron Devices Letters IEEE* (November 2005) Volume 26, Issue 11, pp. 820-82.

By depositing a contact etch-stop silicon nitride layer (CESL) on top of the transistors as a stress liner, strain can be introduced in the channel region. In the case of pMOS devices, both tensile and compressive layers show improved device performance, while for nMOS devices, only tensile layers give a higher performance. With the dual CESL approach, both types of stress can be introduced in the CMOS device. The main disadvantages of this technique are the additional process steps which are needed to deposit both compressive and tensile CESL.

A second approach for introducing uniaxial strain is the introduction of recessed, strained SiGe in the source and drain regions of a MUGFET device, as explained in a paper by P. Verheyen et al., "25% drive current improvement for p-type multiple gate FET (MuGFET) devices by the introduction of recessed $Si_{0.8}Ge_{0.2}$ in the source and drain regions." *Symposium of VLSI Technology Digest of Technical Papers* 2005 (14-16 Jun. 2006), pp. 194-195. By etching the silicon substrate, recesses are formed and selective epitaxial SiGe is deposited in these recesses. Due to the larger lattice constant of SiGe compared to Si, the channel region in between the source/drain regions is put under uniaxial compressive stress, which is only favorable for pMOS devices.

The main disadvantage of all the proposed methods found in the prior art is that in most cases, only the mobility of one majority carrier type (e.g., electrons in the n-type MUGFET transistor in case of SSOI as stressor) is enhanced whereas the mobility of the other majority carrier type (e.g., holes in the p-type MUGFET transistor in case of SSOI as stressor) remains equal or is even degraded. Therefore, there remains a need for a method that enables mobility enhancement for both NMOS and PMOS simultaneously.

A second disadvantage of all the proposed methods found in the prior art is that solutions are sought to enhance the strain in the NMOS or in the PMOS transistor by introducing strain (putting more strain) by means of a stressor. Hence, there is a need for methods to selectively decrease the strain in a strained material in a controlled manner.

SUMMARY OF CERTAIN INVENTIVE ASPECTS

One aim of certain aspects of the present invention is to introduce a method to enhance the mobility in a multi-gate device by introducing strain in the multi-gate device and by controlled relaxing of this strain for the NMOS or the PMOS MUGFET.

In one aspect, a method is disclosed for relaxing strain in a multi-gate device, the method comprising providing a substrate with a strained material, patterning a plurality of fins in the strained material, defining a first region comprising at least one fin, defining a second region comprising at least one fin, providing a diffusion barrier layer on the first region, performing a hydrogen anneal such that the strained material of the at least one fin in the second region is relaxed.

The diffusion barrier layer of the present invention may comprise nitride. Alternatively the diffusion barrier layer may be a contact-etch-stop layer (CESL). This contact-etch-stop layer may be tensile or compressive strained.

The thickness of the diffusion barrier layer is generally dependent on annealing parameters of the hydrogen anneal. The annealing parameters of the hydrogen anneal chosen from e.g. temperature, pressure, concentration, time period. The thickness of the diffusion barrier layer may be in the range of about 5 nm to about 50 nm.

In one embodiment, the thickness of the diffusion barrier layer is chosen so that no hydrogen can flow through the diffusion barrier layer. The strained material is not affected by the hydrogen anneal. The strained material of the at least one fin in the first region remains unchanged after the step of performing a hydrogen anneal.

In another embodiment, the thickness of the diffusion layer is chosen so that the strained material is partially relaxed by the hydrogen anneal. After the step of performing the hydrogen anneal, the strained material in the at least one fin in the first region is partially relaxed.

In one embodiment, the method for relaxing strain in a multi-gate device is based on a hydrogen anneal step. The hydrogen anneal step may be done at a temperature of about 900 degrees Celsius or less. In one embodiment, the temperature for the hydrogen anneal is further dependent on the thickness of the diffusion barrier layer. The hydrogen anneal step may be done in a time period within the range of about 1 minute to about 5 minutes. In one embodiment, the time period for the hydrogen anneal is further dependent on the thickness of the diffusion barrier layer.

In another embodiment, the substrate of the present invention comprises a strained material. The strained material can be strained silicon. The strained material may also comprise SiGe.

In one embodiment, the substrate is a SSOI substrate. In another embodiment, the substrate is a SGOI substrate.

In one embodiment, the first region is an NMOS region and the second region is a PMOS region. In this embodiment, the strain of the PMOS region is relaxed by performing the hydrogen anneal step.

In another embodiment, the first region is a PMOS region and the second region is an NMOS region. In this embodiment, the strain of the NMOS region is relaxed by performing the hydrogen anneal step.

Aspects of the invention are also related to a method for relaxing strain in a semiconductor device comprising the steps of: providing a substrate comprising a strained material; defining a first region; defining a second region; providing a diffusion barrier layer on the first region; performing a hydrogen anneal such that the strained material in the second region is relaxed. The strained material in the first region can be partially relaxed after the step of performing a hydrogen anneal. According to one embodiment, the diffusion barrier layer has a thickness, the thickness being dependent on annealing parameters of the hydrogen anneal.

BRIEF DESCRIPTION OF THE DRAWINGS

All drawings are intended to illustrate some aspects and embodiments of the present invention. The drawings described are only schematic and are non-limiting. In the drawings, the size of some of the elements may be exaggerated and not drawn on scale for illustrative purposes.

DETAILED DESCRIPTION OF CERTAIN INVENTIVE EMBODIMENTS

Figure 1:
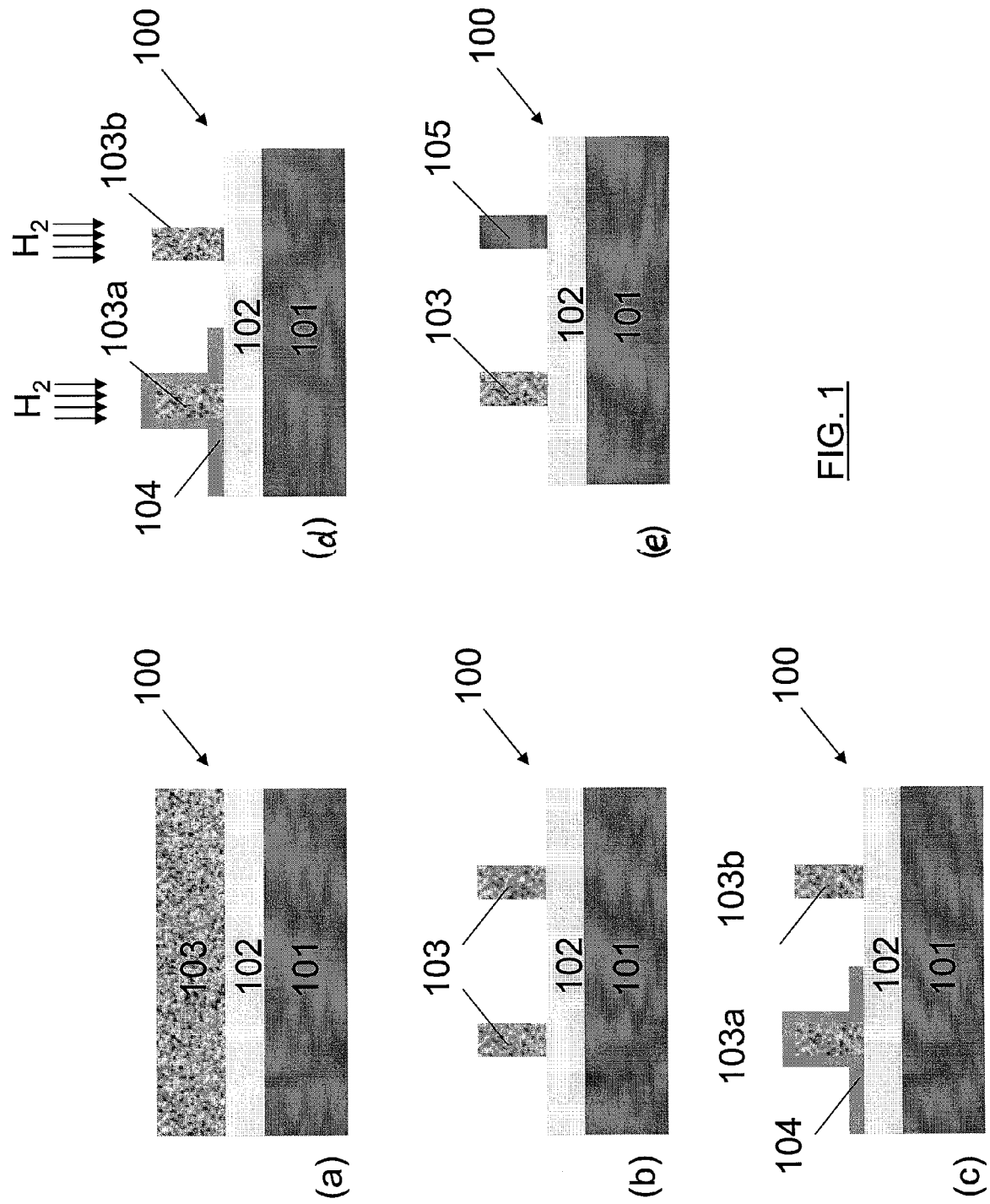
FIGS. 1(a) to 1(e) are a schematic presentation of a process flow for relaxing the strain in a region according to an embodiment of this invention.

One or more embodiments of the present invention will now be described in detail with reference to the attached figures, while the invention is not limited thereto. The drawings described are only schematic and are non-limiting. In the drawings, the size of some of the elements may be exaggerated and not drawn to scale for illustrative purposes. Those skilled in the art can recognize numerous variations and modifications of this invention that are encompassed by its scope. Accordingly, the following description of certain inventive embodiments should not be deemed to limit the scope of the present invention.

Furthermore, the terms first, second and the like in the description and in the claims are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

The term "diffusion barrier layer" as referred to in this application is used to define a layer which blocks the hydrogen completely or partially during the hydrogen anneal step. If the diffusion barrier layer completely blocks the hydrogen, the hydrogen cannot diffuse through this diffusion barrier layer. This means that the underlying material (positioned under the diffusion barrier layer and separated from the hydrogen ambient by the diffusion barrier layer) will not be affected by the hydrogen. If the diffusion barrier layer partially blocks the hydrogen, the hydrogen can partially diffuse through this diffusion barrier layer. This means that the underlying material (positioned under the diffusion barrier layer and separated from the hydrogen ambient by the diffusion barrier layer) will be affected by the hydrogen.

An embodiment of the present invention is related to a method of relaxing the strain in a portion of a strained layer of a semiconductor substrate, comprising the steps of: providing a semiconductor substrate comprising a strained layer on the top surface of the substrate; defining a first and second region on the substrate; depositing a diffusion barrier layer on the first region; performing a hydrogen anneal step, to thereby relax the strain in the second region.

Preferably, the method of an embodiment of the invention is preceded and/or followed by method steps for the production of semiconductor devices in the first and second regions. Preferably, at least two semiconductor devices are produced, preferably transistor devices, at least one device being located in the first region of a substrate, and at least one device being located in the second region.

According to the methods of embodiments of the invention, the substrate on which the devices are produced comprises a strained layer at the top surface of the substrate. This can be a strained silicon layer on a graded SiGe layer, or a Si on SOI layer, or a strained silicon layer on a SGOI substrate, or other. After the H2-anneal step, the diffusion barrier layer is preferably removed.

A 'hydrogen anneal' is defined as an annealing step in a hydrogen atmosphere, such as known in the art.

Further steps to produce the transistors are according to prior art methods. An embodiment involves the production of MUGFET devices, where the strained layer is first patterned to form at least two fins. After this, the steps of the method as described above are performed on the first and second regions, each comprising at least one fin.

According to another embodiment, the method is for producing planar devices. In that case, the strained layer is not patterned before performing the remaining steps of the method.

According to one embodiment, the two regions have a different polarity, in which case the step of defining the regions involves several implantation steps. According to another embodiment, the regions are of the same polarity, and can be created by one implantation step and defined by defining the area corresponding to each region.

The deposition of the diffusion barrier layer preferably takes place through a series of process steps, each of the steps being known in the art (photolithography, etching, CVD, ...), as described in more detail later.

The diffusion barrier layer is preferably a layer comprising or consisting of a nitride, such as SiN or SiON.

The thickness of the diffusion barrier layer can be defined to obtain several results, in combination with the parameters of the hydrogen anneal. All these parameters (thickness of barrier, $H_2$-anneal parameters) can be chosen to completely or partially maintain the strain in the region covered by the barrier. Preferred thicknesses and parameters for the anneal steps are given further in the text.

A planar field effect transistor consists of a channel which is in the plane of the wafer surface and a gate which is located on top of this wafer surface in the same plane as the channel. Embodiments of the present invention can be related to multi-gate field effect transistors (MUGFET). For fabricating a multi-gate field effect transistor, a semiconductor material (e.g., Si, SiGe) is patterned to form a fin-like shaped body. Due to this fin-shaped body a multi-gate device is also often referred to as a finfet device. The fin is raised above the wafer/substrate surface. The fin is determined by its width (W), height (H) and length (L) and comprises a top surface, a bottom surface and two sidewall surfaces. A gate electrode is wrapped around the channel region of the fin. Depending on the shape of the gate electrode, different types of multi-gate field effect transistors can be defined. A double-gate finfet is a multi-gate device where the gate only controls the conductivity of the two sidewall surfaces of the fin. Such a device is also often referred to as a double-gate device. An omega-gate finfet ($\Omega$-gate finfet) is a multi-gate device where the gate controls the conductivity of the two sidewall surfaces and the top surface of the fin. A U-gate finfet is a multi-gate device where the gate controls the conductivity of the two sidewall surfaces and the bottom surface of the fin. A round-gate finfet is a multi-gate device where the gate controls the conductivity of the two sidewall surfaces, the top surface of the fin and the bottom surface of the fin.

A MUGFET can be fabricated on a silicon-on-insulator substrate (SOI). SOI substrates can be made in different ways, such as separation by implanted oxygen (IMOX) or wafer bonding. In order to introduce strain in the substrate, strained silicon-on-insulator substrates (SSOI) or relaxed $Si_{1-x}Ge_x$-on-insulator (SGOI) can be used. A strained silicon-on-insulator (SSOI) substrate combines the benefits of using a silicon-on-insulator (SOI) substrate (improved isolation, reduction of parasitic capacitance) and the benefits of using strained silicon (mobility enhancement). An insulating layer is formed in between a strained silicon layer and the bulk substrate. The substrate can be formed from, e.g., silicon. The strained silicon layer can have a thickness within a range of, e.g., about 10 nm to about 50 nm. The insulating layer is typically $SiO_2$ and can have a thickness of, e.g., about 130 nm.

A relaxed $Si_{1-x}Ge_x$-on-insulator (SGOI) substrate combines the benefits of using an SOI substrate (improved isolation, reduction of parasitic capacitance) and using SiGe technology (mobility enhancement). An insulating layer is formed in between a relaxed $Si_{1-x}Ge_x$ layer and the bulk silicon substrate. The relaxed $Si_{1-x}Ge_x$ layer has a thickness within a range of, e.g., about 10 nm to about 50 nm. The insulating layer is typically $SiO_2$ with a thickness of, e.g., about 130 nm. Additionally, a silicon layer can be grown epitaxially on top of the SGOI substrate. Due to the mismatch in lattice constant between Si and SiGe, the silicon layer will be under tensile strain. A strained SiGe layer can also be grown epitaxally on top of the SGOI substrate.

An embodiment of the present invention provides a method for controlled relaxing the strain in a multi-gate device. After fin patterning in the strained material of a substrate a first and a second region are defined, each comprising at least one fin. In a next step, a diffusion barrier layer is deposited on the first region and a hydrogen anneal is performed such that the strain in the strained material in the second region, which is not covered by this diffusion barrier layer, is relaxed.

Each of the steps of the present invention will now be described in more detail with reference to FIG. 1. The starting material is a substrate (100) comprising a bulk layer 101, an insulating layer 102 and a strained material (103) (FIG. 1a). The strained material is chosen preferably from strained Si or strained SiGe. The substrate can be, e.g., an SSOI substrate, a SGOI substrate with a strained Si surface layer, a graded SiGe substrate with strained Si surface layer. Alternatively a substrate with a rotated notch can be used to further enhance the mobility in the device.

A plurality of fins (103) is patterned in the strained material by using a photolithographic step or by using spacer technology for patterning spacer defined fins (FIG. 1b). At least two fins are patterned. At this point, all the fins comprise the strained material (103). The width and the height of the fins are depending on the technology node. The width of the fin may be, e.g., within a range of about 10 nm to about 50 nm. The height of the fin may be, e.g., within a range of about 10 nm to about 60 nm. For example for a 32 nm technology node, the fin width is about 10 nm to 20 nm and the fin height is about 60 nm.

In a next step (FIG. 1c), a first region (103a) is defined comprising at least one fin and a second region (103b) is defined comprising at least another fin. After this step of defining the first 103a and the second 103b regions, the fins of the first and second regions all comprise strained material.

In a next step a diffusion barrier layer (104) is provided at least on the patterned fins of the first region (103a) (FIG. 1c). The diffusion barrier layer may comprise nitride. The deposition can be done by Chemical Vapour Deposition (CVD), e.g., Low Pressure-CVD (LP-CVD), plasma enhanced CVD or any other deposition technique known in the art. The thickness of the diffusion barrier layer depends on the hydrogen annealing parameters.

In a next step, a hydrogen (H$_2$) anneal is performed (FIG. 1d). During this H$_2$ anneal, the strained material in the at least one fin of the second region, which is not covered by the diffusion barrier layer, will reflow and the strain will be relaxed. After the hydrogen anneal (FIG. 1e) the strained material in the first region (103) remains strained, while the strain in the strained material of the second region (105) is relaxed. The thickness of the diffusion barrier layer depends on the parameters of the hydrogen anneal step, e.g., temperature, time period, concentration, pressure. The temperature and time period of the hydrogen anneal can be chosen so that the hydrogen does not affect the strain of the strained material in the at least one fin of the first region, which is covered by the diffusion barrier layer. This means the diffusion barrier layer completely blocks the hydrogen. Depending on the fin width, the parameters of the hydrogen anneal can be adapted in order to ensure a reflow of the strained material. Smaller fin widths can have a smaller thermal budget for the hydrogen anneal in order to relax the strained material. The hydrogen anneal can be at a temperature of below about 900 degrees Celsius during a time period in the range of about 1 minute to about 5 minutes. For a fin width between about 10 nm and about 50 nm, a hydrogen anneal is performed for about 2 minutes at about 900 degrees Celsius. It is however also believed that by adapting the thickness of the diffusion barrier layer, more or less hydrogen will be blocked by the diffusion barrier layer and consequently more or less strain will be relaxed in the strained material covered by the diffusion barrier layer. The diffusion barrier layer can thus also be used to completely or partially block the hydrogen from flowing to the strained material underneath the diffusion barrier layer and thereby relaxing the strain in the strained material. The amount of strain relaxation is also dependent on the hydrogen anneal parameters, e.g., pressure, temperature, concentration, time period.

In one embodiment, the diffusion barrier layer 104 comprises nitride, e.g SiN or SiON.

In another embodiment, the diffusion barrier layer is a contact-etch-stop layer (CESL), which can be a silicon nitride layer, a siliconcarbide or siliconoxidecarbide layer, or any layer that is a hydrogen diffusion barrier as defined in the present text. The CESL layer may be compressive or tensile. The CESL layer blocks the hydrogen during the hydrogen anneal step. Additionally, the CESL layer also introduces more strain in the underlying material. For enhancing the mobility in the nMOS MUGFET the CESL layer can be tensile strained, while for enhancing the mobility in the pMOS MUGFET the CESL layer can be compressively strained.

In one embodiment, the substrate comprises strained silicon. The substrate can be, e.g., an SSOI substrate, a SGOI substrate with a strained Si surface layer, a graded SiGe substrate with a strained Si surface layer.

In an alternative embodiment, the substrate comprises silicon germanium. The substrate can be, e.g., a SGOI substrate.

Figure 2:
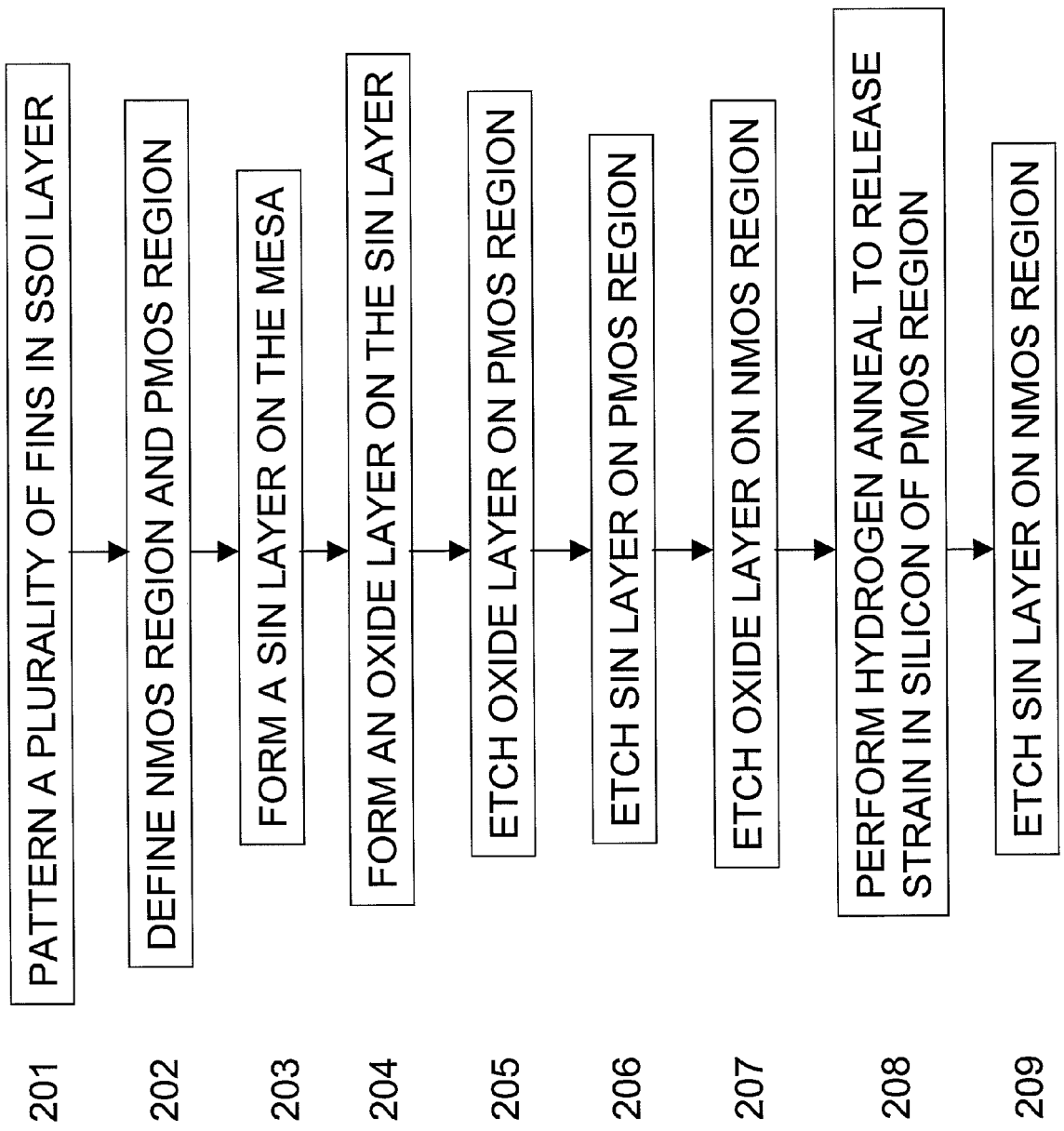
FIG. 2 represents a flow diagram for relaxing the strain in a pMOS region in a MUGFET on a SSOI substrate according to an embodiment of this invention.

FIG. 2 is a flow diagram illustrating one embodiment of a method for relaxing strain in a multi-gate device. As a starting material, an SSOI substrate is used. This embodiment can easily be adapted by a person skilled in the art for any substrate comprising strained silicon. A plurality of fins is patterned in the strained silicon layer by using a photolithographic step or by using spacer technology for patterning spacer defined fins (201). At least two fins are patterned. In a next step, the nMOS region is defined comprising at least one fin and the pMOS region is defined comprising at least one fin (202). After this step of defining the nMOS and the pMOS region, the fins of the pMOS and nMOS region both comprise strained silicon. The strained silicon is beneficial for the electrons mobility in the at least one fin of the nMOS region, but not for the holes mobility in the at least one fin of the pMOS region. To enhance the mobility of the holes in the at least one fin of the pMOS region, it is an object of embodiments of the invention to relax the strain in the strained silicon in the pMOS region. In a next step, a SiN layer is deposited on the patterned fins (step 203). This can be done by CVD. The thickness of the SiN layer depends on parameters of the hydrogen anneal step, e.g., temperature, time period, pressure, concentration. Instead of a SiN layer, a contact-etch-stop layer can be used. By using a compressive strained contact-etch-stop layer, even more strain can be introduced under at least one fin of the nMOS region. Next, an oxide layer is deposited on top of the SiN layer (step 204). The deposition of the oxide can be done by CVD. This oxide is used as a protective layer for the diffusion layer. The protective layer is thin enough to not add additional strain, thick enough to act as H2 barrier. The thickness of this diffusion layer should not be affected during the patterning process, hence an additional layer is added which is easy to remove with high selectivity with respect to the diffusion layer. The thickness of the oxide layer can be in the range of about 2 nm to about 20 nm. Next, a photoresist layer is applied on the nMOS and pMOS regions. The pMOS region is exposed to light whereafter the photoresist is removed from the pMOS region. Next, the oxide layer is locally etched by using a photoresist etch mask such that the underlying SiN layer is exposed for the pMOS area, while the oxide layer and SiN layer remain on the nMOS area (step 205). The etching step can be done by a wet chemical etching, such as etching in 5% buffered HF. After this step, the photoresist on the nMOS region is stripped and the SiN layer on the pMOS region is selectively etched (step 206). The oxide layer on the nMOS region acts as a hardmask for the etching of the SiN layer which can be done by a wet chemical etching, such as etching in phosphoric acid ($H_3PO_4$) at 150 degrees Celsius. After this step, the remaining oxide layer on the nMOS region is removed (step 207). This step of removing the oxide can be done by a wet chemical etching step. In a next step, the at least one fin of strained silicon in the nMOS region is still covered with the SiN layer, whereas the at least one fin of strained silicon in the pMOS region is uncovered. The SiN layer on the at least one fin of strained silicon in the nMOS region is the diffusion barrier layer. In a next step, a hydrogen ($H_2$) anneal is performed (step 208). During this $H_2$ anneal, the silicon in the at least one fin of the pMOS region, which is not covered by the SiN layer, will reflow and the strain will be relaxed, whereas for the at least one fin in the nMOS region the strained silicon will remain strained due to the SiN layer which covers the at least one fin. The hydrogen does not affect the strain of the silicon which is covered by the SiN layer which blocks the hydrogen completely. In a next step, the SiN layer is etched away towards the insulating layer of the SSOI substrate (step 209), e.g., with the insulating layer acting as an etch-stop layer. By using the method as described in embodiments of the present invention, the at least one fin in the nMOS region is formed of strained silicon, which is the starting material, whereas the at least one fin of the pMOS region is formed of lower strained (relaxed) silicon.

Figure 3:
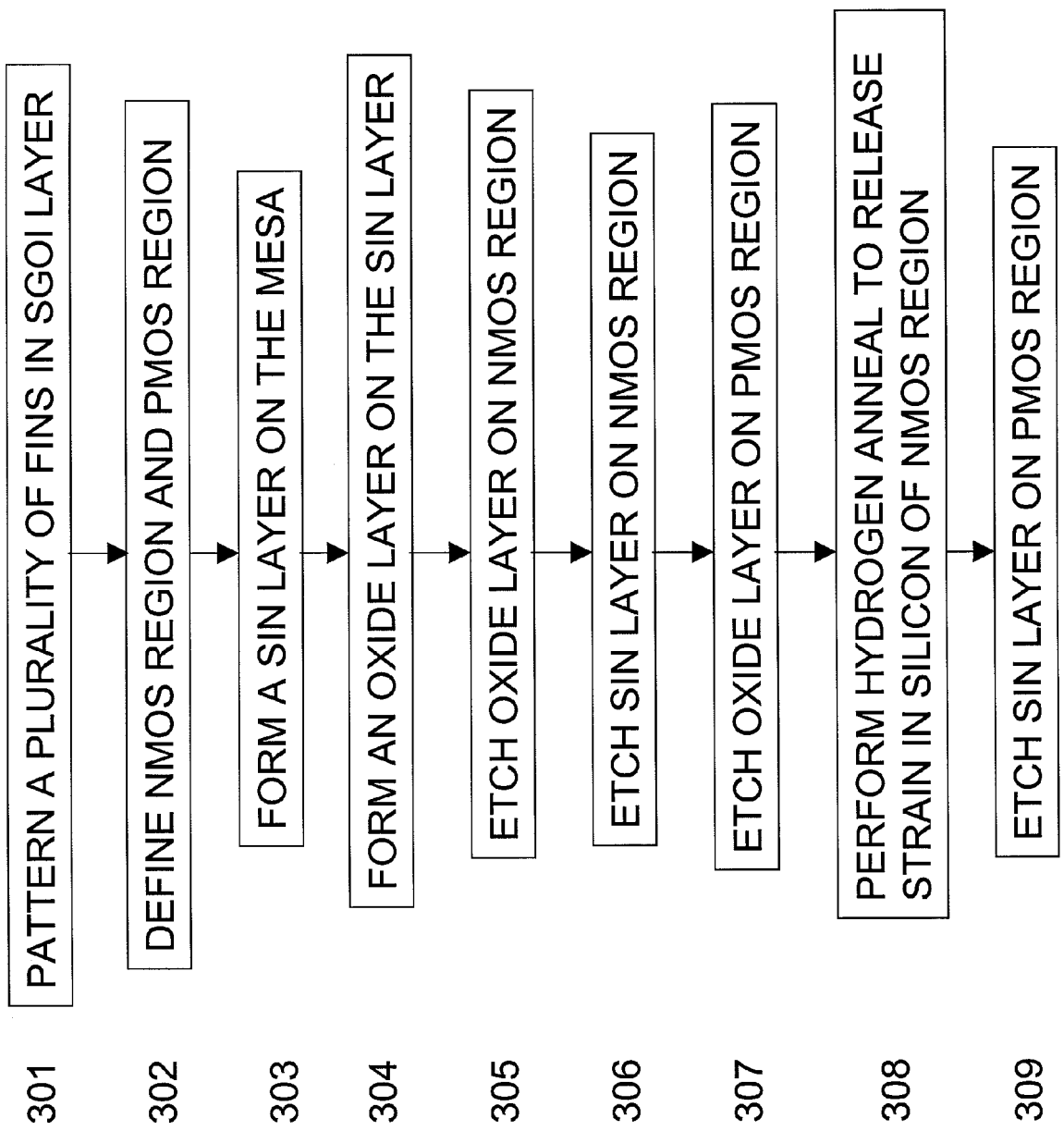
FIG. 3 represents a flow diagram for relaxing the strain in a nMOS region in a MUGFET on a SGOI substrate according to an embodiment of this invention.

FIG. 3 is a flow diagram illustrating another embodiment of a method for relaxing strain in a multi-gate device. As a starting material, an SGOI substrate is used. This embodiment can easily be adapted by a person skilled in the art for any substrate comprising strained SiGe. A plurality of fins is patterned in the strained SiGe layer by using a photolithographic step or by using spacer technology for patterning spacer defined fins (step 301). At least two fins are patterned. In a next step, the nMOS region is defined comprising at least one fin and the pMOS region is defined comprising at least one fin (step 302). After the step of defining the nMOS and the pMOS regions, the fins of the pMOS and nMOS regions both comprise strained SiGe. The strained SiGe is beneficial for the hole mobility in the at least one fin of the pMOS region, but not for the electron mobility in the at least one fin of the nMOS region. To enhance the mobility of the electrons in the at least one fin of the nMOS region, in one aspect, an embodiment of the invention relaxes the strain in the strained SiGe in the nMOS region. In a next step, a SiN layer is deposited on the patterned fins (step 303). This can be done by CVD. The thickness of the SiN layer depends on the parameters of the hydrogen anneal, e.g., temperature, time period, concentration, pressure. Instead of a SiN layer, a contact-etch-stop layer can be used. By using a tensile strained contact-etch-stop layer, even more strain can be introduced under the at least one fin of the pMOS region. Next, an oxide layer is deposited on top of the SiN layer (step 304). The deposition of the oxide can be done by CVD. The thickness of the oxide layer can be in the range of about 2 nm to about 20 nm. Next, a photoresist layer is applied on the nMOS and pMOS regions. The nMOS region is exposed to light whereafter the photoresist is removed from the nMOS region. Next, the oxide layer is locally etched by using the photoresist etch mask such that the underlying SiN layer is exposed for the nMOS area, while the oxide layer and SiN layer remain on the pMOS area (step 305). The etching step of the nMOS oxide layer can be done by a wet chemical etching, such as etching in 5% buffered HF. After this step, the photoresist is stripped and the SiN layer on the nMOS region is selectively etched (step 306). The oxide layer on the pMOS region acts as a hardmask for the etching of the SiN layer which is preferably done by a wet chemical etching, such as etching in phosphoric acid ($H_3PO_4$) at about 150 degrees Celsius. After this step, the remaining oxide layer on the pMOS region is removed (step 307). This step of removing the oxide can be done by a wet chemical etching step. In a next step, the at least one fin of strained SiGe in the pMOS region is still covered with the SiN layer whereas the at least one fin of strained SiGe in the nMOS region is uncovered. In a next step, a hydrogen ($H_2$) anneal is performed (step 308). During this $H_2$ anneal, the SiGe in the at least one fin of the nMOS region, which is not covered by the SiN layer, will reflow and the strain will be relaxed, whereas for the at least one fin in the pMOS region the strained SiGe will remain strained due to the SiN layer which covers the at least one fin. The $H_2$ does not affect the strain of the SiGe covered by the SiN layer that blocks the hydrogen completely. In a next step, the SiN layer is etched away towards the insulating layer of the SGOI substrate (step 309). By using the method as described in the present invention, the at least one fin in the pMOS region is formed of strained SiGe, which is the starting material, whereas the at least one fin of the nMOS region is formed of lower strained (relaxed) SiGe.

After performing methods according to embodiments of the present invention, the multi-gate device comprising at least one fin in the nMOS region and at least one fin in the pMOS region can further be processed following the different fabrication steps known for a person skilled in the art, such as depositing a gate oxide, gate patterning, source/drain extension implantations. It is obvious to a person skilled in the art that in these following processing steps, other stressors can be added to the multi-gate device in order to further enhance the mobility of the multi-gate device, such as SiGe source/drain regions, additional CESL layers, etc. These stressors can be added to the nMOS region or to the pMOS region.

Methods according to embodiments of the present invention can also be applied to analogue I/O applications or to electrostatic discharge (ESD) transistors. The problem of electrostatic discharge, or ESD, is a concern to IC manufacturers. ESD occurs when a finite amount of electrostatic charge is transferred between two objects at different electrostatic potentials caused by direct contact or by an electrostatic field. Due to this transfer of charge, a huge amount of current can flow through the chip in a very short period of time, resulting in damage to the circuit. By using different transistors with different resistances, circuits can be built which are resistant to disturbance from electrical discharges. In order to get transistors with high and low resistance properties, the mobility in these transistors can be tuned. This tuning of the mobility can be done by applying the method of the present invention. By applying different hydrogen anneal parameters or by using different thickness for the barrier diffusion layer for each of the transistors, the strain in the transistors can be tuned. The embodiments of the present invention thus allow, for example, the formation of a high mobility nMOS transistor and a low mobility nMOS transistor starting from the same material stack.

A plurality of fins is patterned in the strained material by using a photolithographic step or by using spacer technology for patterning spacer defined fins. At least two fins can be patterned. At this point, all the fins comprise the strained material. The width of the fin can be chosen within a range of about 10 nm to about 50 nm. The height of the fin can be chosen within a range of about 10 m to about 60 nm.

In a next step, a first region is defined comprising at least one fin, and a second region is defined comprising at least another fin. After this step of defining the first and the second regions, the fins of the first and second regions all comprise strained material. In this example, the fins of the first and the second regions form devices of the some conductivity type, such as nMOS transistors. In a next step, a diffusion barrier layer is provided at least on the patterned fins of the first region. The diffusion barrier layer may comprise nitride. The deposition can be done by CVD, e.g., LP-CVD, plasma enhanced CVD or any other deposition technique known in the art. The thickness of the diffusion barrier layer depends on the hydrogen annealing parameters.

In a next step, a hydrogen ($H_2$) anneal is performed. During this $H_2$ anneal, the strained material in the at least one fin of the second region, which is not covered by the diffusion barrier layer, will reflow, and the strain will be relaxed. The thickness of the diffusion barrier layer depends on the temperature and time period of the hydrogen anneal step. Preferably, the temperature and time period of the hydrogen anneal are chosen so that the hydrogen does not affect the strain of the strained material in the at least one fin of the first region, which is covered by the diffusion barrier layer. This means that the diffusion barrier layer completely blocks the hydrogen. Depending on the fin width, the parameters of the hydrogen anneal are adapted in order to ensure a reflow of the strained material.

Methods according to embodiments of the present invention can also be applied to planar devices. Different stressors can also be introduced to enhance the mobility in the channel region for planar devices. By using the method of the present invention, the strain in the channel region can be relaxed in a controlled manner. The embodiments of the present invention thus allow, for example, the formation of a high mobility nMOS transistor with a channel region of strained silicon and a high mobility pMOS transistor starting from the same material stack.

An nMOS transistor and a pMOS transistor are defined in a substrate comprising a strained material. The channel regions of the nMOS transistor and the pMOS transistor both comprise the strained material. The strained silicon is beneficial for the electron mobility in the nMOS transistor, but not for the hole mobility in the pMOS transistor. To enhance the mobility of the holes in the pMOS transistor, in one aspect, an embodiment of the invention relaxes the strain in the strained silicon in the pMOS region.

In a next step, a diffusion barrier layer is provided at least on channel region of the nMOS transistor. The diffusion barrier layer may comprise nitride. The deposition can be done by CVD, e.g., LP-CVD, plasma enhanced CVD or any other deposition technique known in the art. The thickness of the diffusion barrier layer depends on the hydrogen annealing parameters, e.g., temperature, time period, pressure, concentration.

In a next step, a hydrogen ($H_2$) anneal is performed. During this $H_2$ anneal, the strained material in the channel of the pMOS transistor, which is not covered by the diffusion barrier layer, will reflow and the strain will be relaxed. The temperature and time period of the hydrogen anneal are chosen so that the hydrogen does not affect the strain of the strained material in the channel of the nMOS transistor, which is covered by the diffusion barrier layer.

After performing methods according to embodiments of the present invention, the planar CMOS device comprising at least one nMOS region and at least one pMOS region can further be processed following the different fabrication steps known to a person skilled in the art, such as depositing a gate oxide, gate patterning, source/drain implantations. It is obvious to a person skilled in the art that in these subsequent processing steps, other stressors can be added to the multigate device in order to further enhance the mobility of the planar CMOS device, such as SiGe source/drain regions, additional CESL layers. These stressors can be added to the nMOS region or to the pMOS region.

EXAMPLE

Figure 4:
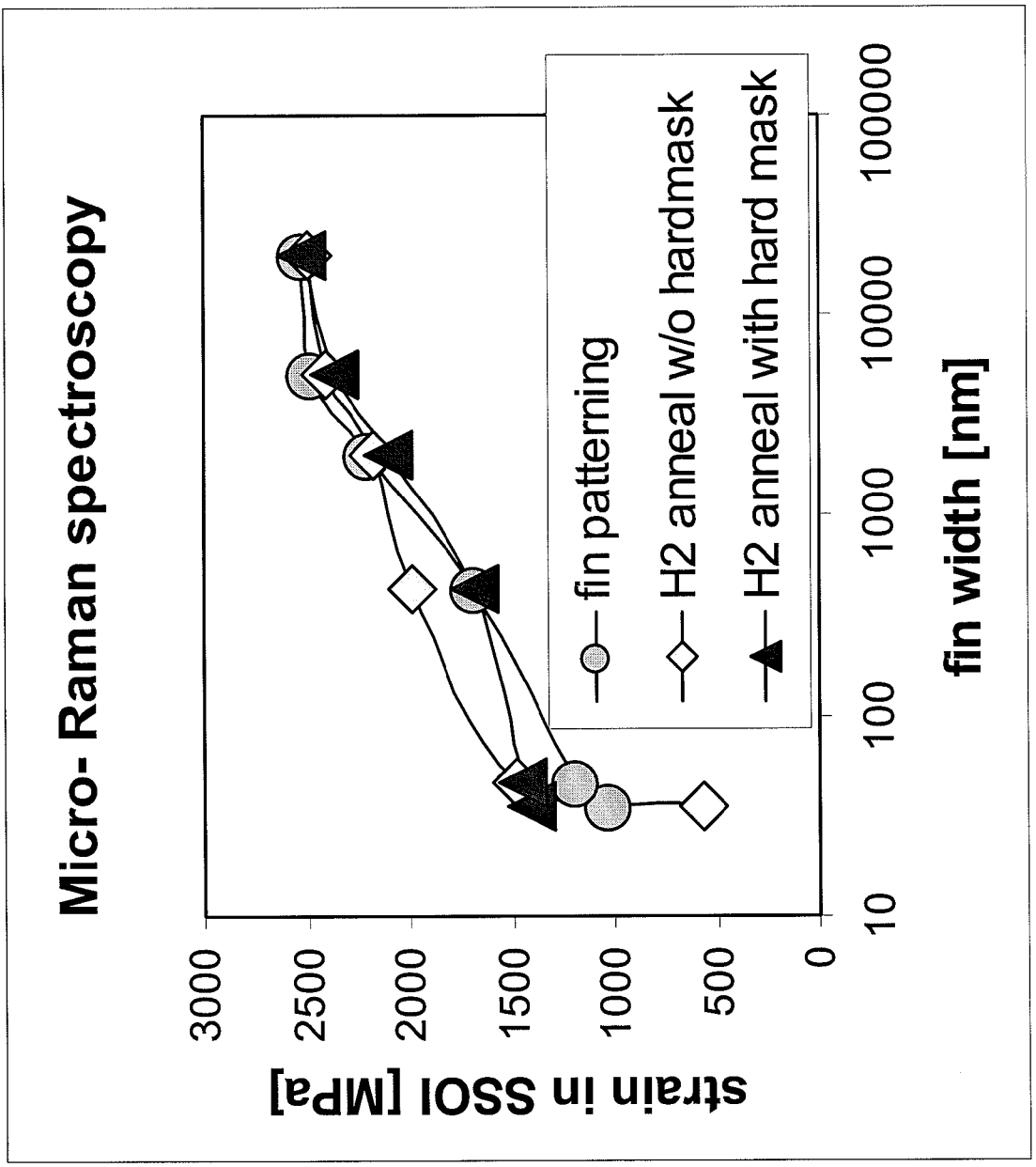
FIG. 4 illustrates the effect of hydrogen ($H_2$) anneal on the strain in an nMOS MUGFET fabricated on an SSOI substrate according to an embodiment of the invention. Experimental results are shown from micro-Raman measurements. The circles show the strain as a function of the fin width after fin patterning. The diamonds show the strain as a function of the fin width after $H_2$ anneal without using a diffusion barrier layer (without a hard mask). The triangles show the strain as a function of the fin width after $H_2$ anneal with a diffusion barrier (with a hard mask).

FIG. 4 illustrates the effect of $H_2$ anneal on the strain in an nMOS MUGFET fabricated on an SSOI substrate. Experimental results from micro-Raman (μ-Raman) spectroscopy measurements are shown. The circles show the strain as a function of the fin width after fin patterning. The triangles show the strain as a function of the fin width after $H_2$ anneal with a hard mask. The hard mask acts as a diffusion barrier layer. The hard mask is a nitride/oxide mask. The diamonds show the strain as a function of the fin width after $H_2$ anneal without using a diffusion barrier layer, e.g., without a hard mask.

After fin patterning of the SSOI substrate, the total amount of strain is reduced with decreasing fin width. This can be attributed to the change of biaxial stress for wide fins, to uniaxial longitudinal tensile stress for narrow fins. For fins with a fin width between about 50 nm and about 2 μm, an increase of the strain level can be observed for the devices with $H_2$ anneal (without hard mask). This can be attributed to the extra strain introduced by the surface reflow in wide fins. However, for fins with a fin width below about 50 nm, the Si reflow affects the entire fin and leads to relaxation of the strain. Whereas the strain after fin patterning is about 1000 MPa, the strain after $H_2$ anneal (without hard mask) has decreased to about 500 MPa. Covering the fins with a fin width of about 35 nm with a nitride/oxide hard mask during the $H_2$ anneal, increases the strain again by as much as a factor of about 2.5, more specifically from about 500 MPa to about 1400 MPa. One can also observe that the strain for fins with a fin width of about 35 nm with hard mask capping during the $H_2$ anneal is higher than after the fin patterning. This can be attributed to the strain induced by the hard mask during $H_2$ anneal.

While the invention has been described in connection with specific embodiments thereof, it will be understood that it is capable of further modification, and this application is intended to cover any variations, uses, or adaptations of the invention following, in general, the principles of the invention and including such departures from the present invention as would be understood to those in the art as equivalent and the scope and context of the present invention is to be interpreted as including such equivalents and construed in accordance with the claims appended hereto.

What is claimed is:

1. A method of relaxing the strain in a portion of a strained layer of a semiconductor substrate, comprising:
    providing a semiconductor substrate comprising a strained layer on a top surface of the substrate;
    defining a first and a second region on the substrate;
    depositing a diffusion barrier layer on the first region;

hydrogen annealing, to thereby relax the strain in the second region.

2. The method according to claim 1, further comprising forming one or more semiconductor devices in each of the first and second regions.

3. The method according to claim 2, wherein the devices are MUGFET devices, and wherein defining the first and second regions is preceded by forming a plurality of fins in the strained layer.

4. The method according to claim 2, wherein the devices are planar devices.

5. The method according to claim 1, wherein the diffusion barrier layer comprises a nitride.

6. The method according to claim 5, wherein the nitride is a silicon nitride (SiN) or a silicon oxynitride (SiON).

7. The method according to claim 1, wherein the diffusion barrier layer is a contact etch stop layer.

8. The method according to claim 1, wherein the diffusion barrier layer has a thickness of between about 5 nm and about 50 nm.

9. The method according to claim 1, wherein the hydrogen anneal occurs at a temperature of about 900° C. or less.

10. The method according to claim 1, wherein the hydrogen anneal occurs during a time period of between about 1 minute and about 5 minutes.

11. The method according to claim 1, wherein the substrate is a silicon-on-insulator (SOI) substrate comprising a strained silicon layer.

12. The method according to claim 1, wherein the substrate is a silicon germanium-on-insulator (SGOI) substrate comprising a strained silicon layer.

13. The method according to claim 1, wherein the first region is an NMOS region, and the second region is a PMOS region.

14. The method according to claims 1, wherein the first and second regions have the same polarity.

15. The method according to claim 1, wherein the diffusion barrier layer has a thickness, and the thickness of the diffusion barrier layer and parameters of the hydrogen anneal are chosen to completely maintain strain in the first region.

16. The method according to claim 1, wherein the diffusion barrier layer has a thickness, and the thickness of the diffusion barrier layer and parameters of the hydrogen anneal are chosen so as to partially maintain strain in the first region.

17. The method of claim 7, wherein the contact-etch-stop layer is tensile strained.

18. The method of claim 7, wherein the contact-etch-stop layer is compressive strained.

19. The method of claim 1, wherein the strained layer comprises SiGe.

* * * * *